United States Patent
Yang et al.

(10) Patent No.: US 9,196,270 B1
(45) Date of Patent: Nov. 24, 2015

(54) METHOD FOR PROVIDING A MAGNETORESISTIVE ELEMENT HAVING SMALL CRITICAL DIMENSIONS

(75) Inventors: Danning Yang, Fremont, CA (US); Guanghong Luo, Fremont, CA (US); Yun-Fei Li, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 1673 days.

(21) Appl. No.: 11/635,830

(22) Filed: Dec. 7, 2006

(51) Int. Cl.
*G11B 5/31* (2006.01)
*G11B 5/39* (2006.01)
*H01L 21/311* (2006.01)
*H01L 21/314* (2006.01)

(52) U.S. Cl.
CPC .............. *G11B 5/3163* (2013.01); *G11B 5/39* (2013.01); *G11B 5/3903* (2013.01); *G11B 5/3932* (2013.01); *H01L 21/3144* (2013.01); *H01L 21/31138* (2013.01); *Y10T 29/49041* (2015.01); *Y10T 29/49048* (2015.01); *Y10T 29/49052* (2015.01)

(58) Field of Classification Search
CPC ...... G11B 5/3163; G11B 5/39; G11B 5/3903; G11B 5/3932; Y10T 29/49041; Y10T 29/49048; Y10T 29/49052; H01L 21/31138; H01L 21/31144
USPC ........ 29/603.12, 603.15, 603.18; 360/125.56, 360/125.62, 125.41, 314, 315, 327.31
See application file for complete search history.

(56) References Cited

U.S. PATENT DOCUMENTS

| 4,939,837 | A | * | 7/1990 | Krounbi ................. 29/603.15 X |
| 5,654,128 | A | | 8/1997 | Hsu |
| 5,669,133 | A | | 9/1997 | George |
| 5,718,976 | A | | 2/1998 | Dorfman et al. |
| 6,156,485 | A | | 12/2000 | Tang et al. |
| 6,211,061 | B1 | | 4/2001 | Chen et al. |
| 6,212,047 | B1 | | 4/2001 | Payne et al. |
| 6,309,955 | B1 | | 10/2001 | Subramanian et al. |
| 6,320,725 | B1 | | 11/2001 | Payne et al. |
| 6,421,212 | B1 | * | 7/2002 | Gibbons et al. .......... 360/327.31 |
| 6,468,642 | B1 | | 10/2002 | Bray et al. |
| 6,493,926 | B2 | | 12/2002 | Han et al. |

(Continued)

FOREIGN PATENT DOCUMENTS

| CN | 1272940 A | 11/2000 |
| CN | 1494060 A | 5/2004 |

OTHER PUBLICATIONS

U.S. Appl. No. 12/060,724, filed Apr. 1, 2008, 26 pages.
(Continued)

*Primary Examiner* — A. Dexter Tugbang

(57) ABSTRACT

The method and system for providing a magnetoresistive device are described. The method and system include depositing a plurality of magnetoresistive element layers which cover at least one device area and at least one field area. The method and system also include providing a single layer mask. The single layer mask covers a first portion of the magnetoresistive element layers in the device area(s) and exposes the magnetoresistive element layers in the field area(s). The method and system include defining the magnetoresistive element(s) using the single layer mask and depositing a hard bias layer on the device area(s) and the field area(s) after the magnetic element(s) are defined. The method and system further include performing a planarization after the hard bias layer is deposited.

12 Claims, 9 Drawing Sheets

(56) References Cited

U.S. PATENT DOCUMENTS

| | | | |
|---|---|---|---|
| 6,495,311 B1 | 12/2002 | Khan et al. |
| 6,496,334 B1 | 12/2002 | Pang et al. |
| 6,582,889 B1 | 6/2003 | Kamijima |
| 6,632,707 B1 | 10/2003 | Wang et al. |
| 6,713,237 B2 | 3/2004 | Seigler et al. |
| 6,728,055 B1 | 4/2004 | Gill et al. |
| 6,798,620 B2 | 9/2004 | Hiramoto et al. |
| 6,801,408 B1 | 10/2004 | Chen et al. |
| 6,989,971 B2 | 1/2006 | Lin et al. |
| 7,037,847 B2 | 5/2006 | Le et al. |
| 7,061,728 B2 | 6/2006 | Pinarbasi |
| 7,070,697 B2 | 7/2006 | Freitag et al. |
| 7,095,585 B2 | 8/2006 | Payne et al. |
| 7,146,711 B2 | 12/2006 | Han et al. |
| 7,163,751 B2 | 1/2007 | Wayton et al. |
| 7,175,944 B2 | 2/2007 | Yin et al. |
| 7,194,797 B2 | 3/2007 | Pinarbasi |
| 7,228,617 B2 | 6/2007 | Lin et al. |
| 7,230,801 B2 | 6/2007 | Lin et al. |
| 7,237,321 B2 | 7/2007 | Cyrille et al. |
| 7,262,138 B1 | 8/2007 | Singh et al. |
| 7,270,917 B2 | 9/2007 | Yin et al. |
| 7,272,080 B2 | 9/2007 | Kudo |
| 7,275,304 B2 | 10/2007 | Sakai et al. |
| 7,283,337 B2 | 10/2007 | Sakai et al. |
| 7,369,371 B2 | 5/2008 | Freitag et al. |
| 7,640,650 B2 | 1/2010 | Araki et al. |
| 8,316,527 B2 | 11/2012 | Hong et al. |
| 8,349,195 B1 | 1/2013 | Si et al. |
| 2002/0093761 A1 | 7/2002 | Payne et al. |
| 2003/0092281 A1 | 5/2003 | Ramachandramurthy |
| 2003/0179497 A1 * | 9/2003 | Harris et al. ......... 360/125.62 X |
| 2005/0024780 A1 | 2/2005 | Pinarbasi |
| 2005/0024793 A1 | 2/2005 | Nakabayashi et al. |
| 2005/0094315 A1 | 5/2005 | Payne et al. |
| 2005/0219771 A1 | 10/2005 | Sato et al. |
| 2005/0227482 A1 | 10/2005 | Korzenski |
| 2006/0025053 A1 | 2/2006 | Cyrille et al. |
| 2006/0044705 A1 | 3/2006 | Hasegawa et al. |
| 2006/0196039 A1 | 9/2006 | Sakai et al. |
| 2006/0198059 A1 | 9/2006 | Sakai et al. |
| 2006/0293208 A1 | 12/2006 | Egbe et al. |
| 2007/0035887 A1 | 2/2007 | Freitag et al. |
| 2007/0048624 A1 | 3/2007 | Chen et al. |
| 2007/0217088 A1 | 9/2007 | Freitag et al. |
| 2007/0218679 A1 | 9/2007 | Schneider et al. |

OTHER PUBLICATIONS

U.S. Appl. No. 11/352,652, filed Feb. 13, 2006, 22 pages.
Office Action issued Dec. 10, 2012 in China Patent Application No. 200910004719.1, filed Feb. 20, 2009, 12 pages.

* cited by examiner

METHOD FOR PROVIDING A MAGNETORESISTIVE ELEMENT HAVING SMALL CRITICAL DIMENSIONS

FIELD OF THE INVENTION

The present invention relates to magnetic recording technology, and more particularly to a method and system for.

BACKGROUND

As memory densities increase, the bit size for recording media decreases. As a result, the critical dimensions of readers and writers decrease. For example, magnetoresistive (MR) elements are often used in higher density read heads. As the memory density of recording media increases, the critical dimension of the magnetoresistive element, which correspond to the track width, decreases. Thus, new methods for fabricating such structures are desired to be found. For example, conventional MR elements have been fabricated using an undercut bilayer mask. The bottom layer of the bilayer mask has a smaller width, or critical dimension, than the upper layer. However, at smaller critical dimensions on the order of 0.06-0.08 µm or less, significant issues are encountered. For example, the bilayer mask tends to collapse. In addition, the track width becomes difficult to control. Consequently, yield is reduced.

In order to address such issues, it would be desirable to use a single layer photoresist mask. FIG. 1 depicts a conventional method 10 for fabricating a MR device. FIGS. 2A-2F depict a conventional MR device 50 during fabrication. Referring to FIGS. 1-2F, the layers of the MR element are provided, via step 12. Typically, step 12 includes sputter depositing the layers for a spin valve or other analogous giant magnetoresistive (GMR) element. These layers are typically on the order of three hundred and seventy Angstroms thick. A planarization stop layer, typically a diamond-like carbon (DLC) layer, and dielectric antireflective coating (DARC) layer are deposited, via step 14 and 16, respectively. The DLC layer is typically on the order of one hundred fifty to two hundred Angstroms thick. A layer of photoresist is provided on the device, via step 18. The photoresist layer is typically on the order of two thousand two hundred Angstroms thick. Thus, the thickness of all of the layers is typically on the order of two thousand seven hundred Angstroms thick. FIG. 2A depicts the conventional MR device 50 formed on a shield 52 and including MR element layers 54, DLC layer 56, DARC layer 58, and photoresist layer 60. Although depicted as a single layer, the MR element layers 54 typically include a laminate of multiple layers.

A single layer photoresist mask is developed from the single layer of photoresist 60, via step 20. FIG. 2B depicts the MR device 50 after formation of the single layer photoresist mask 60'. The mask 60' includes a portion 65 that covers the device area 67. The MR element is to be formed in the device region 67. The mask 60' also includes portions 63 and 64 and has apertures 61 and 62 therein. The apertures 61 and 62 and portions 63 and 64 cover the field areas 66 and 68 of the MR device 50. Typically, the field areas 66 and 68 cover approximately ninety percent of the conventional MR device 50, while the device area 67 occupies approximately ten percent of the conventional MR device 50.

The portions of the layers 56 and 58 exposed by the apertures 61 and 62 are removed, via step 22. Step 22 is typically performed using a reactive ion etch (RIE). FIG. 2C depicts the MR device after step 22 is completed. Thus, the portions 56' and 58' of DLC and DARC layers remain. In addition, a portion of the MR element layers 54 are exposed by the apertures 61 and 62.

The MR element is then defined, via step 24. Step 24 typically includes performing a critical junction ion mill. During the ion mill, some or all of the photoresist mask 60' and underlying the DARC layer 58' may be removed. FIG. 2D depicts the conventional MR device 10 after step 24 is completed. Thus, the MR element 70 has been formed from the MR layers 54. The MR element 70 has a critical dimension CD. In addition, portions 54' of the MR layers remain. These portions 54' of the MR layers reside in the field areas 66 and 68, and are not typically used as a device.

An insulating layer, a hard bias layer, and a capping layer are typically deposited, via step 26. The hard bias layer and capping layer are preferably blanket deposited. FIG. 2D depicts conventional the MR device 50 after step 26 is completed. Thus, the insulating layer 71, hard bias layer 72 and capping layer 74 are shown. Although the hard bias layer 72 and capping layer 74 appear discontinuous, each appearing almost as two separate layers in FIG. 2D, this phenomenon is due to the underlying topology of the conventional MR device 50.

The conventional MR device 50 is planarized, via step 28. Typically step 28 is performed using a chemical mechanical polish (CMP). FIG. 2F depicts the conventional MR device 50 after step 28 has been completed. As a result of the CMP, the top surface of the conventional MR device 50 is flat. Thus, using the conventional method 10, the conventional MR device 50 is fabricated. The conventional method 10 may allow for removal of a "liftoff" step for the photoresist mask 60'. Thus, fencing may be eliminated. In addition, overspray for a tunneling magnetoresistive element may be avoided. Consequently, contact resistance may be better controlled and have a lower variation. In addition, a smaller critical dimension may be directly printed on the photoresist mask 54' and provided for the conventional MR element 70.

Although the conventional method 10 may for the conventional MR device 50, one of ordinary skill in the art will readily recognize that there may be serious drawbacks. Delamination of the MR layers 54 may occur for areas of the conventional MR device 50 on which a stop layer, such as the DLC layer 56', is provided. This delamination adversely affects yield of the conventional MR device 50. Furthermore, during definition of the MR element 70 in step 24, the relatively high thickness of the stack of layers 54, 56', 58', and 60' may result in shadowing. This shadowing may cause asymmetries in the conventional MR device 50, which are undesirable. Furthermore, the topology of the conventional MR device 50 during the CMP in step 28 may result in a non-uniform CMP. Consequently, in contrast to the MR device 50 depicted in FIG. 2F, the surface of the conventional MR device 50 may not be as flat as desired. Consequently, like the use of a bi-layer mask, the conventional method 50 may not be able to fabricate an MR device at higher memory densities and smaller critical dimensions.

Accordingly, what is needed is an improved system and method for providing an MR device suitable for higher memory densities

SUMMARY

A method and system for providing a magnetoresistive device are disclosed. The method and system include depositing a plurality of magnetoresistive element layers which cover at least one device area and at least one field area. The method and system also include providing a single layer mask. The single layer mask covers a first portion of the plurality of magnetoresistive element layers in the at least one device area and exposes the plurality of magnetoresistive element layers in the at least one field area. The method and system include defining the at least one magnetoresistive element using the single layer mask and depositing a hard bias layer on the at least one device area and the at least one field area after the at least one magnetic element is defined. The method and system further include performing a planarization after the hard bias layer is deposited.

DETAILED DESCRIPTION OF THE PREFERRED EMBODIMENTS

Figure 1:
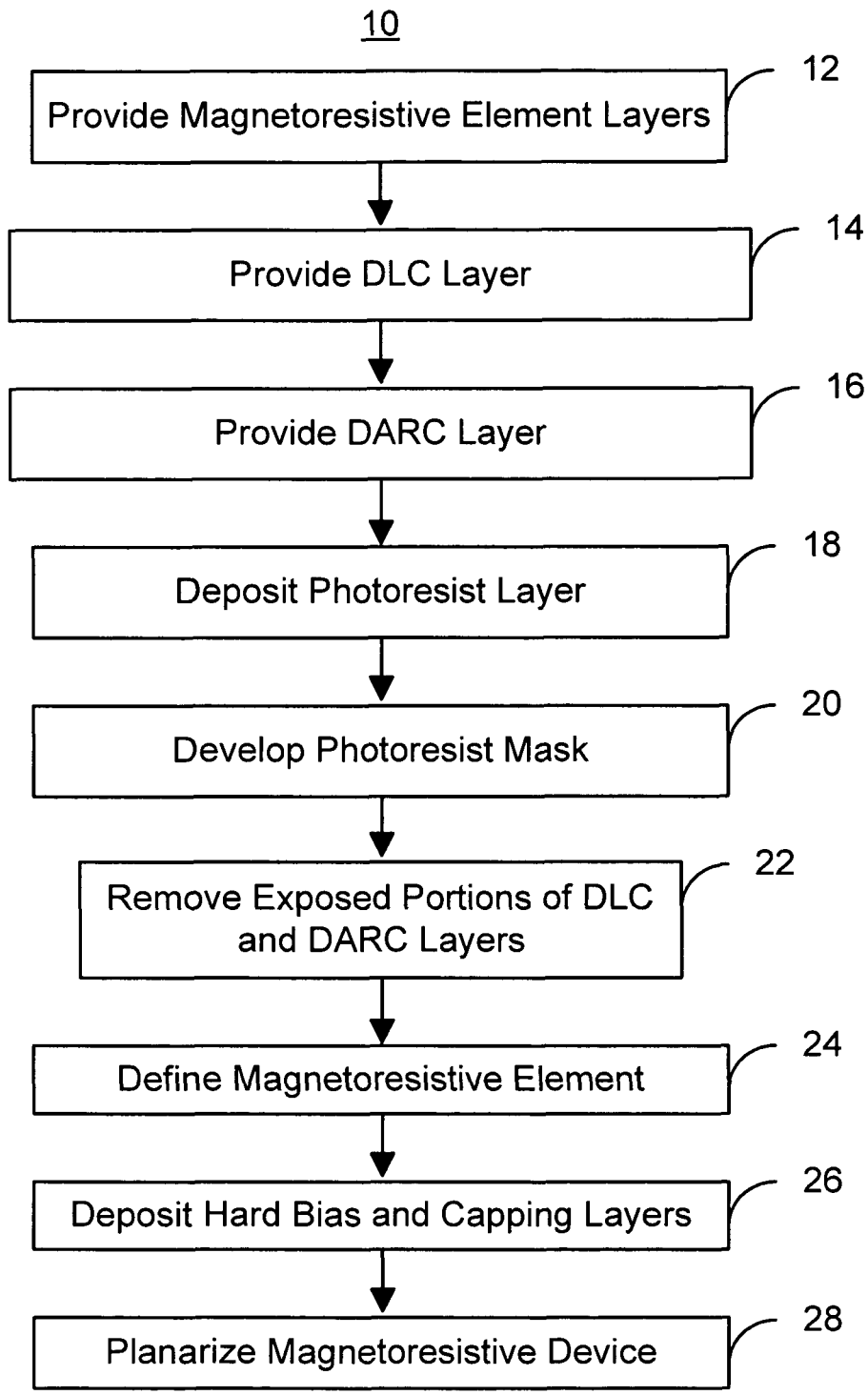
FIG. 1 depicts a conventional method 10 for fabricating a magnetoresistive device.
Figure 2A:
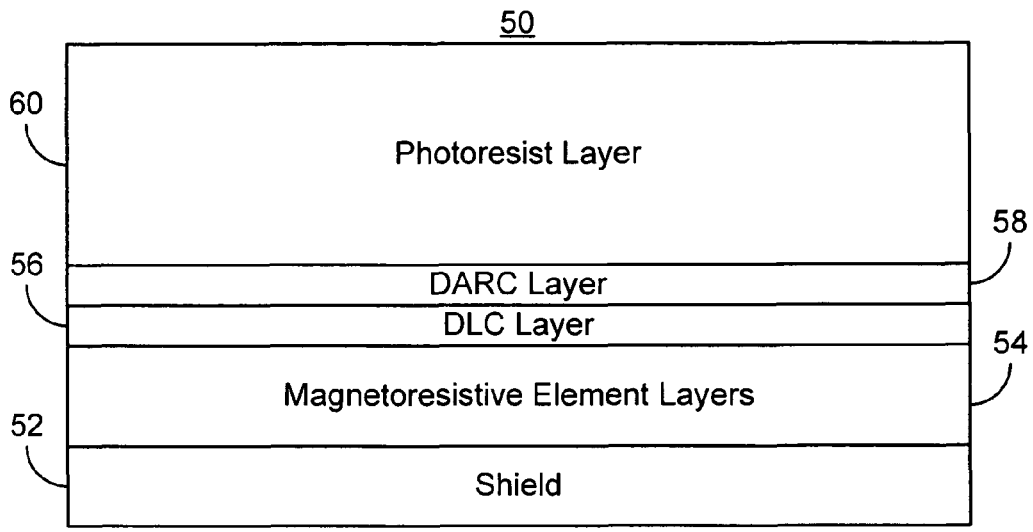
FIGS. 2A-2F depict a conventional magnetoresistive device during fabrication using a single layer photoresist mask.
Figure 2B:
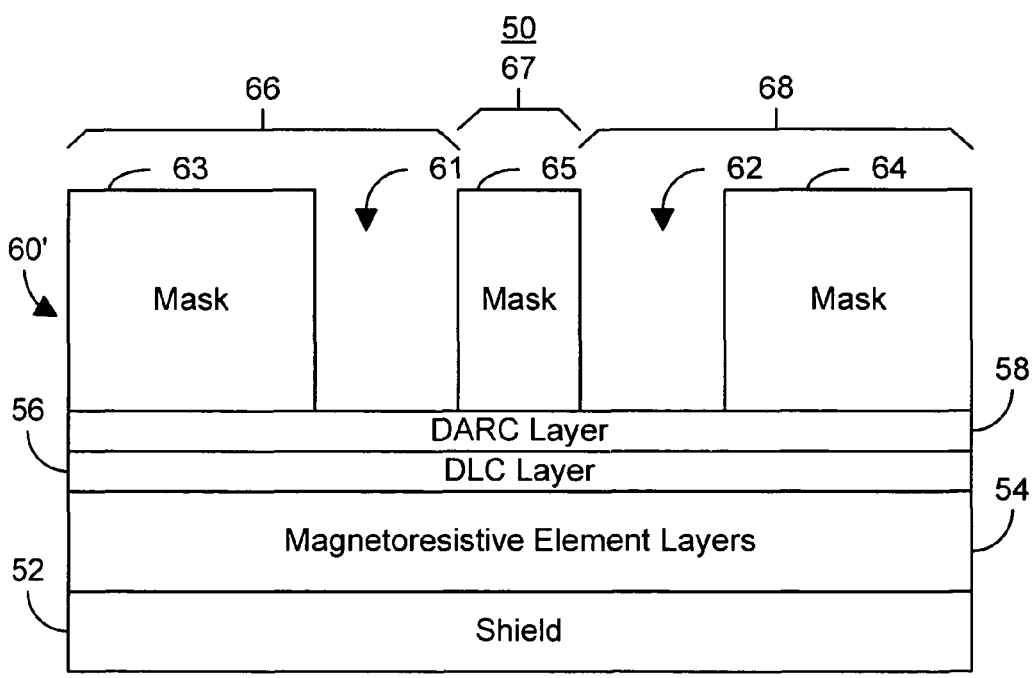
Figure 2C:
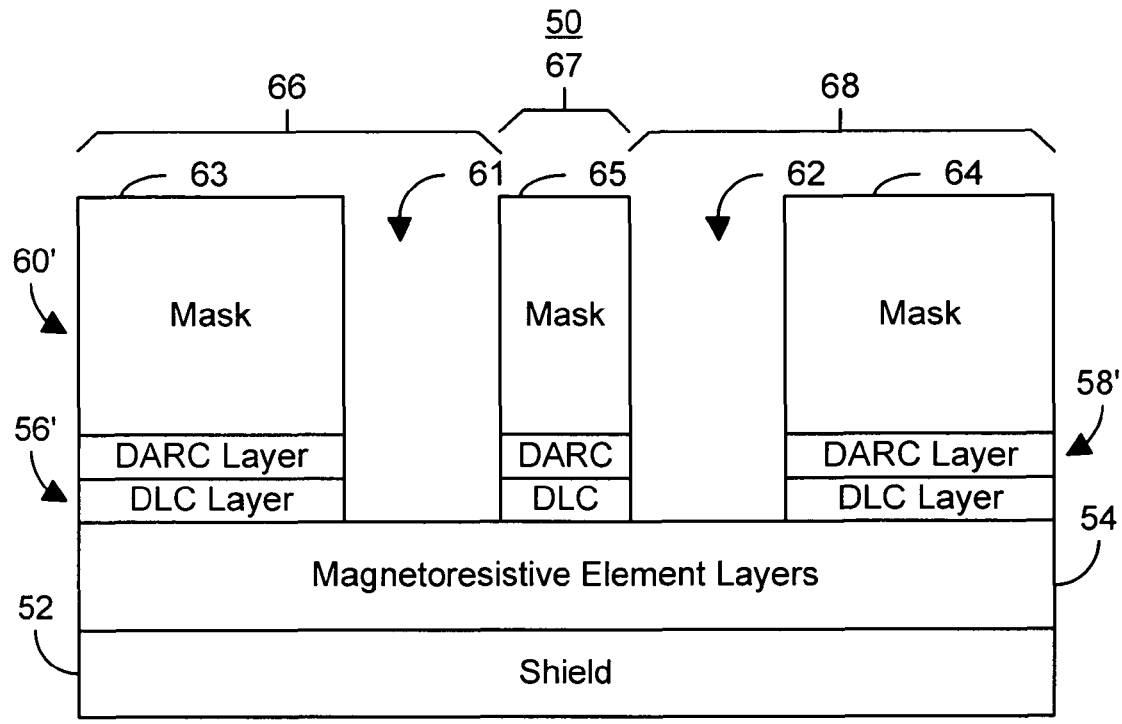
Figure 2D:
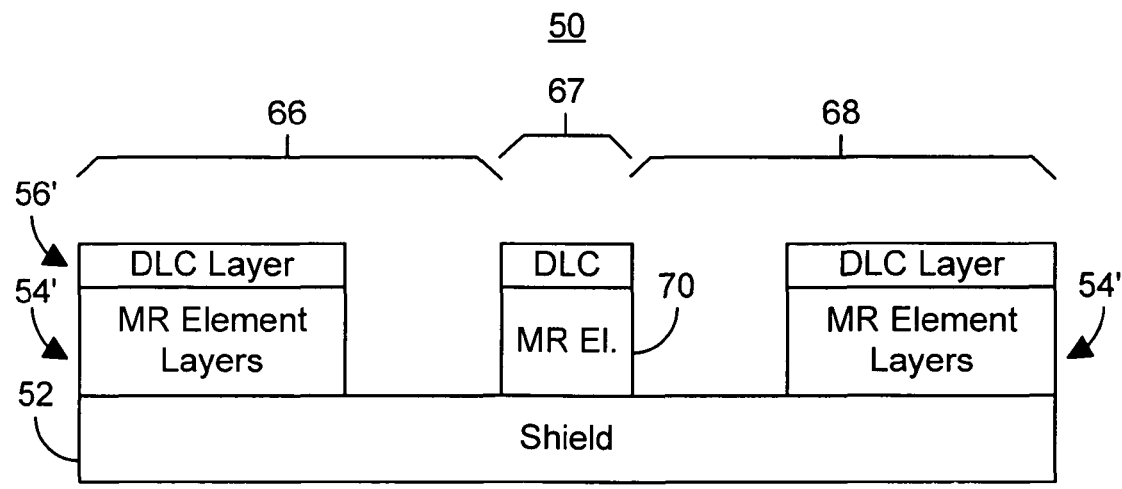
Figure 2E:
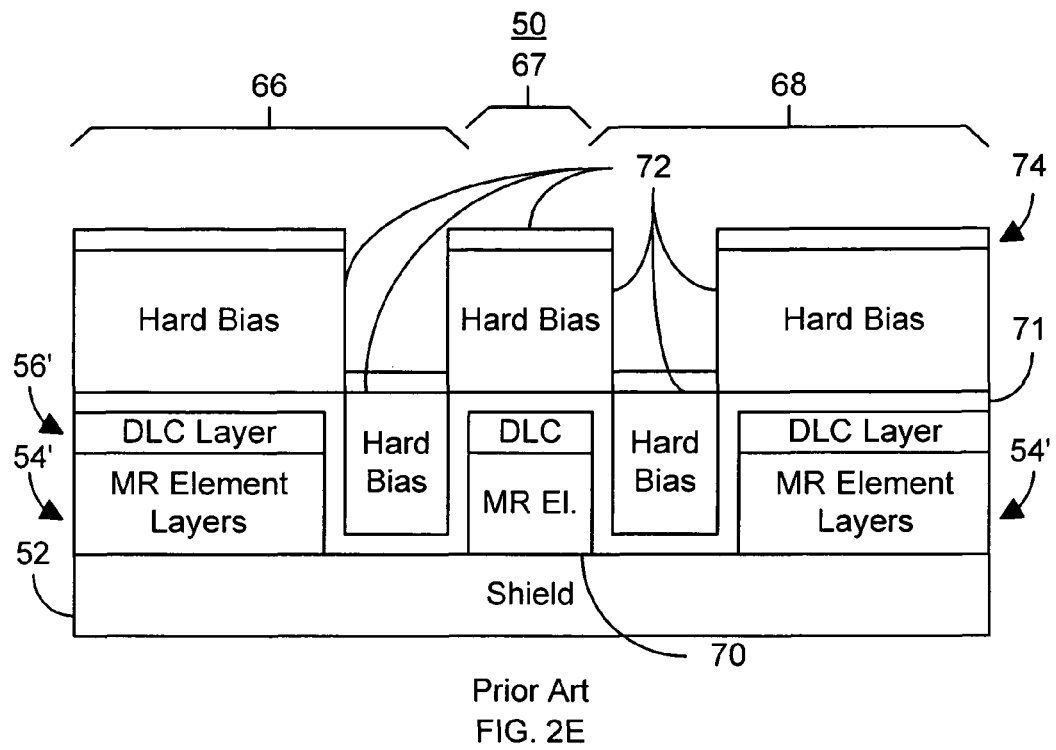
Figure 2F:
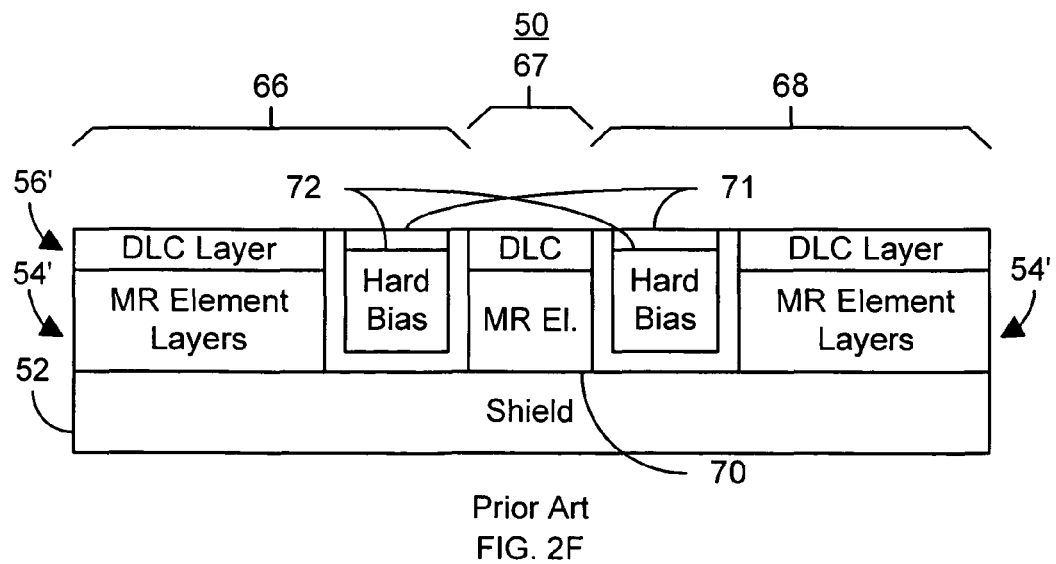
Figure 3:
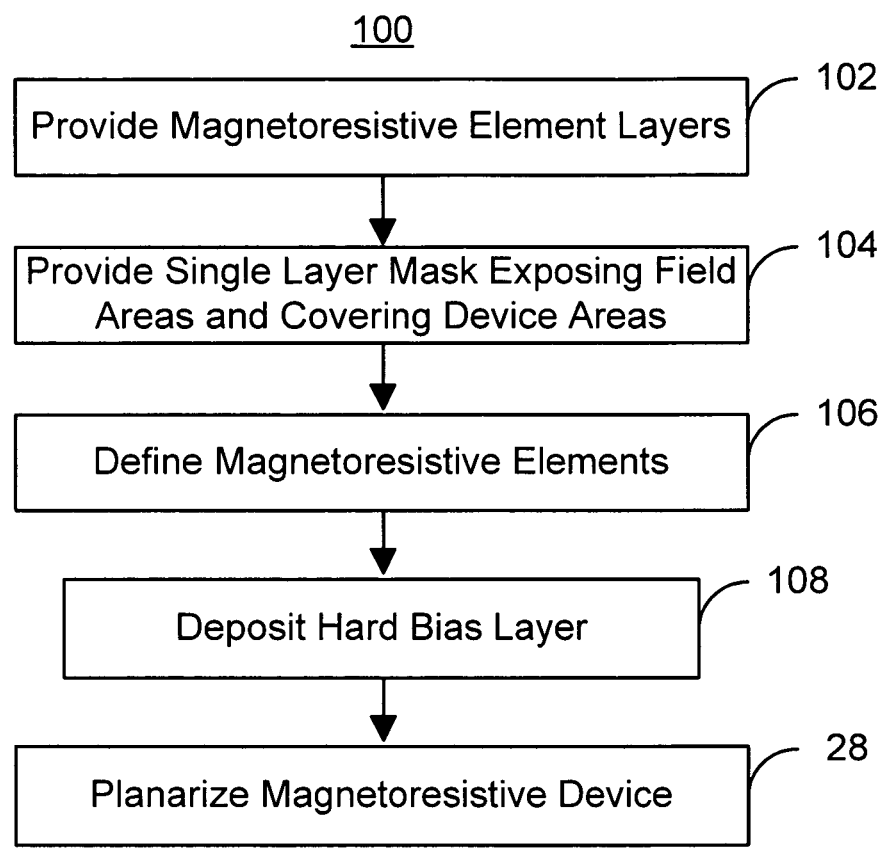
FIG. 3 is a flow chart depicting one exemplary embodiment of a method for fabricating a magnetoresistive device using a single layer mask.

FIG. 3 is a flow chart depicting one exemplary embodiment of a method 100 for fabricating an MR device having smaller critical dimensions. In a preferred embodiment, MR elements having critical dimensions on the order of 0.6-0.8 μm or less may be fabricated. Although the method 100 is described in the context of particular steps and particular MR elements, one of ordinary skill in the art will recognize that other MR elements may be provided and different and/or additional steps may be used. In addition, one of ordinary skill in the art will recognize that the steps described may include one or more sub-steps. In addition, although the method 100 is described in the context of providing single layers, such as a planarization stop layer and antireflective coating layer, unless specified, such a layer may be a laminate of multiple layers.

The MR element layers are deposited, via step 102. The MR element layers cover at least one device area and at least one field area. Thus, in a preferred embodiment, the MR element layers are blanket deposited. The MR layers may include, for example, layers for a spin valve or tunneling MR element. A single layer mask is provided, via step 104. In a preferred embodiment, the single layer mask is a photoresist mask. Thus, step 104 preferably includes depositing a layer of photoresist and transferring a pattern to the photoresist layer. The single layer mask covers the MR element layers in device area(s) and exposes the MR element layers in the field area(s). Thus, the single layer photoresist mask exposes most of the MR device. For an MR device as described above, in which ninety percent of the device corresponds to field areas, the single layer mask would expose approximately ninety percent of the MR device and cover approximately ten percent of the MR device.

The MR element(s) are defined using the single layer mask, via step 106. In a preferred embodiment, step 106 is performed using an ion mill. Because of the configuration of the single layer mask, the majority of the MR element layers are preferably removed in step 106. A hard bias layer is deposited, via step 108. The hard bias layer is deposited at least on the device area(s) and the field area(s) after the MR element(s) have been defined. The hard bias layer is thus preferably blanket deposited in step 108. A planarization is performed after the hard bias layer is deposited, via step 110. The planarization performed in step 110 is preferably a CMP.

Using the method 100, a single layer mask may be employed. Consequently, the advantages of a single layer mask may be achieved. In addition, because the MR element layer and the layers above are removed from the field area(s) in step 106, delamination in the field areas may be avoided. Furthermore, the topology of the MR device for the planarization performed in step 110 may improve the uniformity and shorten the time required for planarization. The shorter time may also consume fewer resources, such as CMP slurry. Moreover, because the method 100 requires few changes in the masks used in conventional processing of MR devices, the method 100 may easily be incorporated into existing processes. In addition, because less shadowing of the MR device may take place, asymmetry of the MR device may be reduced.

Figure 4:
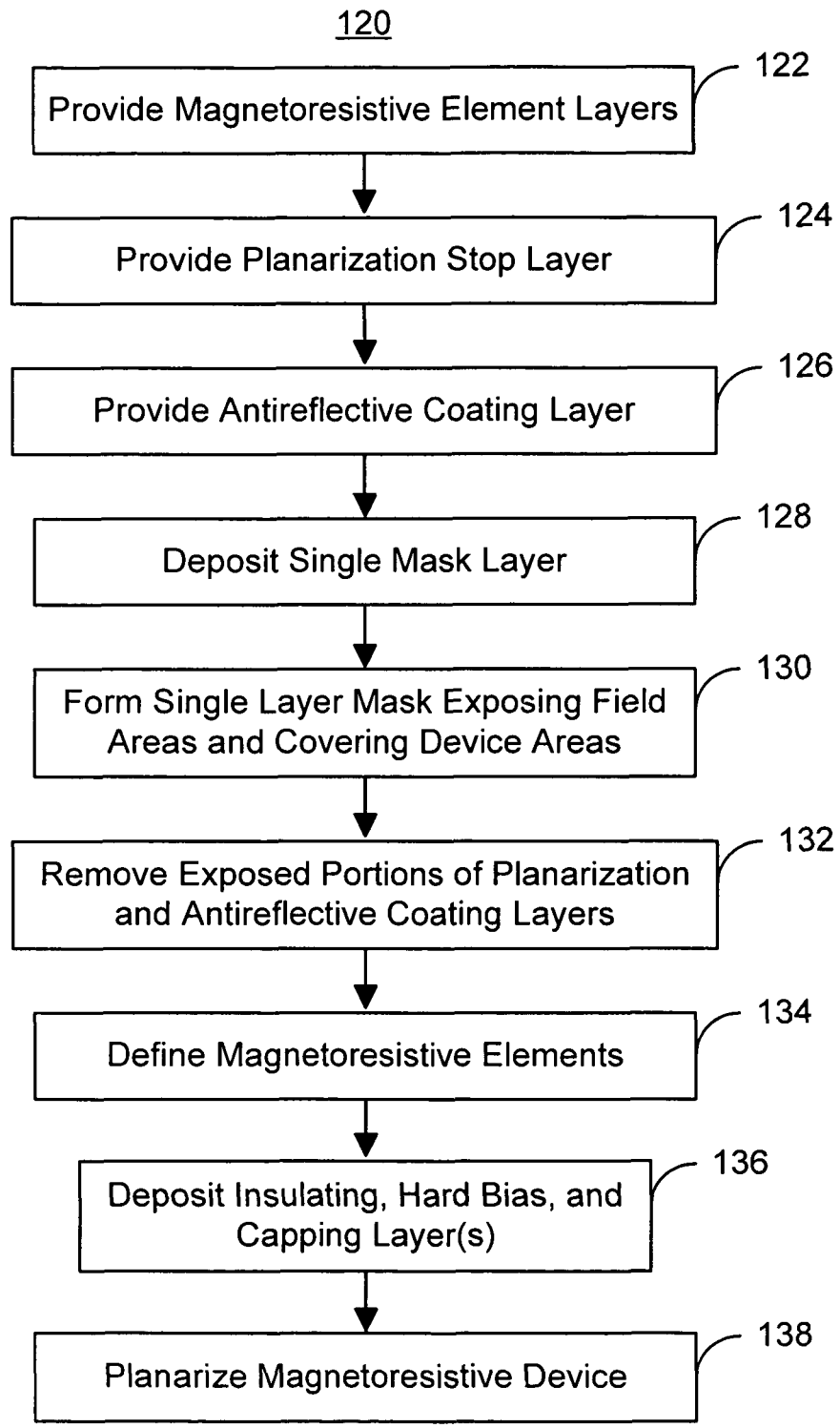
FIG. 4 is a flow chart depicting another exemplary embodiment of a method for fabricating a magnetoresistive device using a single layer mask.

FIG. 4 is a flow chart depicting another exemplary embodiment of a method 120 for fabricating an MR device. FIGS. 5A-5F depict an exemplary embodiment of an MR device 200 during fabrication. Referring to FIGS. 4-5F, in a preferred embodiment, MR elements having critical dimensions on the order of 0.6-0.8 μm or less may be fabricated using the method 120. Although the method 120 is described in the context of particular steps and particular MR elements, one of ordinary skill in the art will recognize that other MR elements may be provided and different and/or additional steps may be used. In addition, one of ordinary skill in the art will recognize that the steps described may include one or more sub-steps. In addition, although the method 120 and MR device 200 are described in the context of providing single layers, such as a planarization stop layer and antireflective coating layer, unless specified, such a layer may be a laminate of multiple layers.

The MR element layers are deposited, via step 122. The MR element layers cover at least one device area and at least one field area. Thus, in a preferred embodiment, the MR element layers are blanket deposited. The MR element layers may include, for example, layers for a spin valve or tunneling MR element. A planarization stop layer is provided on the MR element layers, via step 124. Step 124 preferably include blanket depositing the planarization stop layer over both field(s) and device area(s). In a preferred embodiment, the planarization stop layer is a DLC layer. Consequently, the method 120 and MR device 200 are described in the context of a DLC layer. An antireflective coating layer is provided on the DLC layer, via step 126. The antireflective coating layer is preferably a DARC layer. Consequently, the method 120 and device 200 are described in the context of a DARC layer. A single mask layer is provided on the DARC layer, via step 128. In a preferred embodiment, step 128 includes depositing a single layer of photoresist.

Figure 5A:
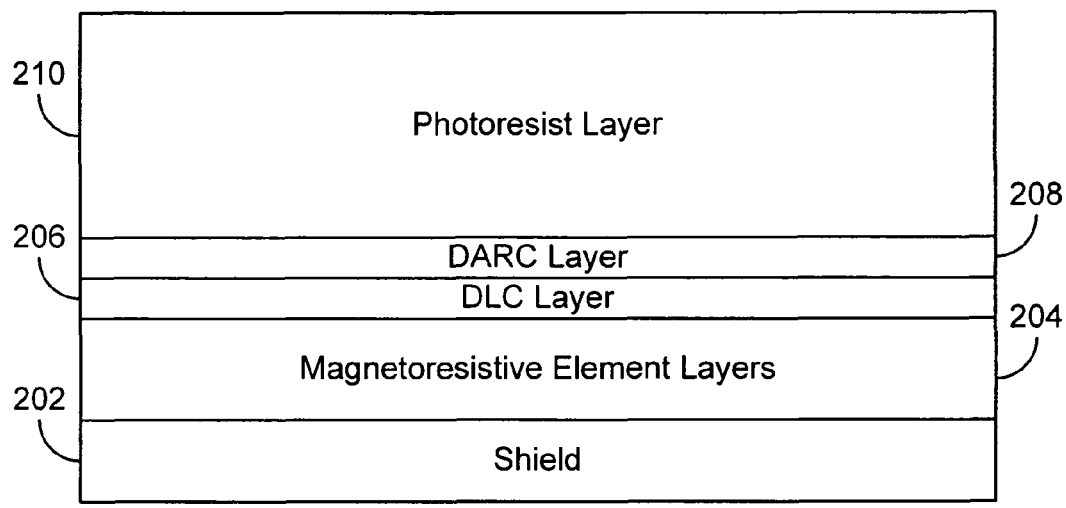
FIGS. 5A-5F depict an exemplary embodiment of a magnetoresistive device during fabrication using a single layer mask.

FIG. 5A depicts the MR device 200 after step 128 has been performed. The MR device 200 is depicted as being formed on a shield 202. The MR device 200 includes MR element layers 204, DLC layer 206, DARC layer 208, and photoresist layer 210. Although depicted as a single layer, as discussed above, the MR layers 204 typically include a laminate of multiple layers. In addition, the DLC layer 206 and DARC layer 208 might include multiple layers.

Figure 5B:
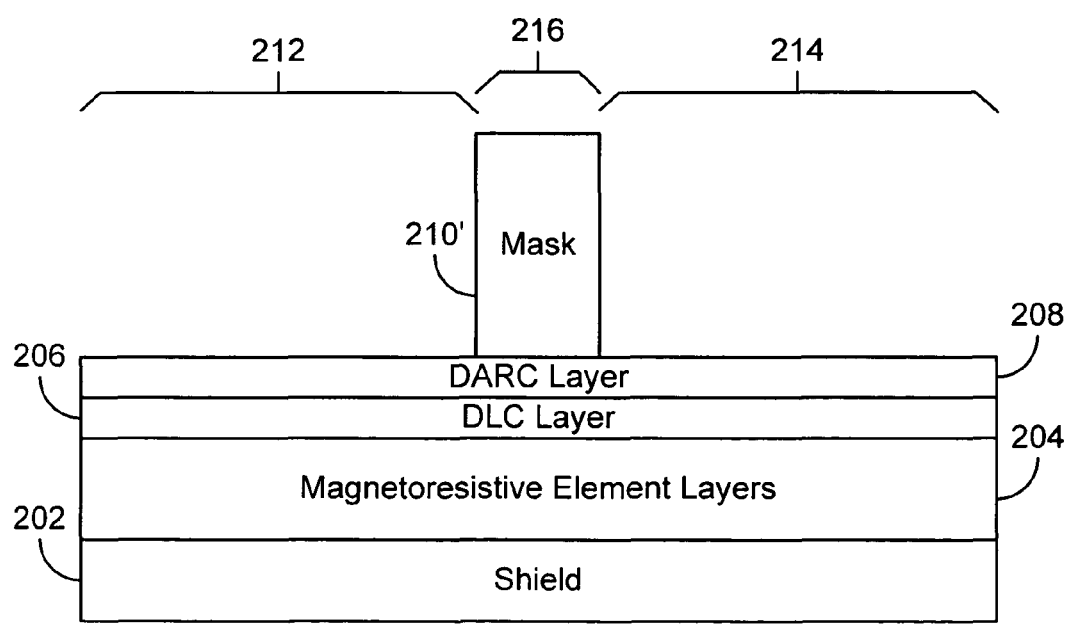

A single layer mask is formed by transferring a pattern to the photoresist layer, via step 130. FIG. 5B depicts the MR device 200 after step 130 is performed. Thus, the single photoresist layer 210 has become a single layer mask 210'. The single layer mask 210' covers the layers 204, 206, and 208 in device area 216 and exposes the layers 204, 206, and 208 in the field areas 212 and 214. Thus, the single layer photoresist mask exposes most of the MR device. For an MR device as described above, in which ninety percent of the device corresponds to field areas 212 and 214, the single layer mask would expose approximately ninety percent of the MR device 200 and cover approximately ten percent of the MR device 200.

Figure 5C:
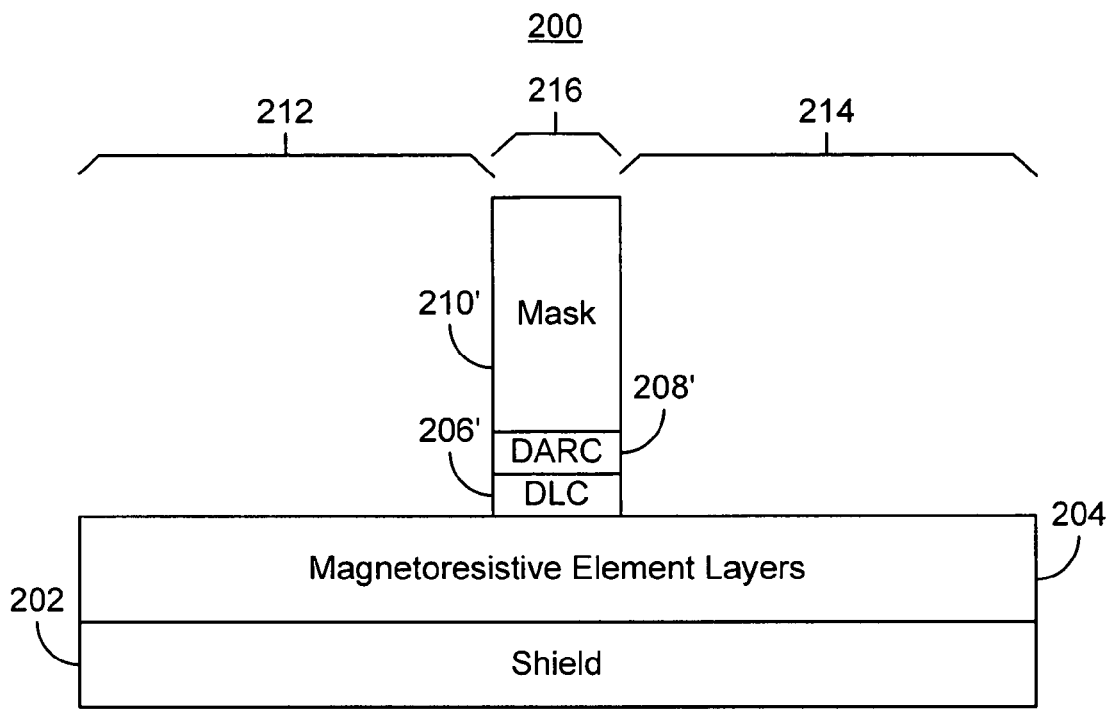

The exposed portions of the DARC layer 208 and the DLC layer 206 are removed, via step 132. Step 132 is preferably performed by performing an RIE. FIG. 5C depicts the MR device 200 after step 132 has been performed. Consequently, only the DLC layer portion 206' and DARC portion 208' in the device area 216 remain. The portions of the MR element layers 204 in the field areas 212 and 214 are exposed.

Figure 5D:
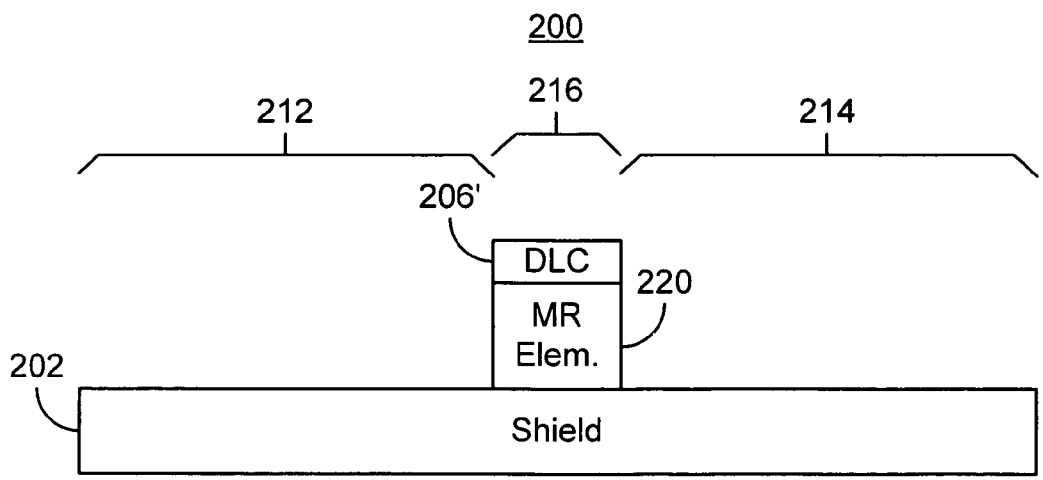

The MR element is defined using the single layer mask 210', via step 134. In a preferred embodiment, step 134 is performed using an ion mill. Because of the configuration of the single layer mask 210', the majority of the MR element layers 204 are preferably removed in step 134. FIG. 5D depicts the MR device 200 after step 134 is performed. The MR element 202 has been formed from the MR element layers 204. In the embodiment shown, the single layer mask 210' and DARC layer 208' have been removed, generally in a separate step (not shown). Consequently, the DLC layer 206' However, in another embodiment the single layer mask 210' may be left in place and removed during the planarization step described below.

Figure 5E:
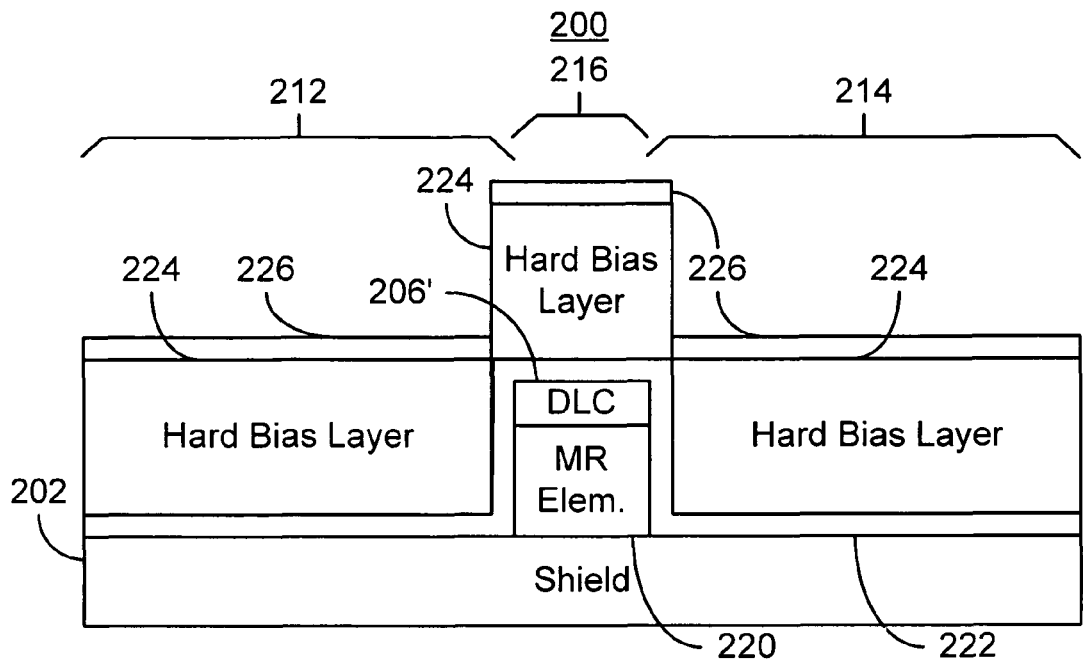
Figure 5F:
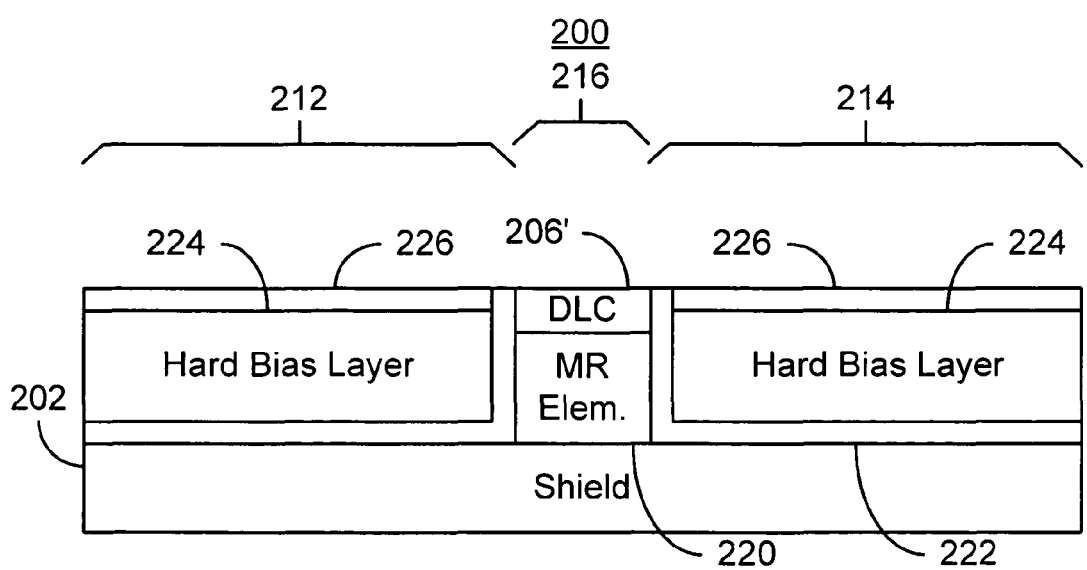

A hard bias layer is deposited, via step 136. In addition, a capping layer and an insulating layer are preferably deposited in step 136. The insulator is preferably deposited prior to the hard bias and capping layers. The insulator layer, hard bias layer, and capping layer are deposited at least on the device area 216 and the field areas 212 and 214 after the MR element 220 has been defined. The hard bias layer and capping layer are thus preferably blanket deposited in step 136. FIG. 5E depicts the MR device 200 after step 136 is performed. Thus, the insulator layer 222, the hard bias layer 224, and capping layer 226 are shown. Although described as single layers, the insulating layer 222, the hard bias layer 224 and/or the capping layer 226 may include multiple layers (not separately shown FIG. 5E). As can be seen in FIG. 5E, the MR device 200 has a "needle" shape, with the portion 224A and 226A of the layers 224 and 226 being higher than the remaining portions of the hard bias layer 224 and capping layer 226, respectively.

A planarization is performed after the insulating layer 222, the hard bias layer 224 and capping layer 226 are deposited, via step 138. The planarization performed in step 138 is preferably a CMP. In one embodiment, the planarization removes a remaining portion of the single layer mask 210' that resides in the device area 216. FIG. 5F depicts the MR device 200 after step 138 is performed. As a result, the hard bias layer portion 224A and the capping layer portion 226A are removed. In addition, a portion of the insulator layer 222 has been removed, leaving insulator layer portions 222'. Consequently, the top surface of the MR device 200 is substantially flat.

Using the method 120, a single layer mask may be employed. Consequently, the advantages of a single layer mask, such as a reduction in shadowing and overspray, may be achieved. In addition, because the single layer mask 210' exposes the field areas 212 and 214, the layers 204, 206, and 208 in the field areas 212 and 214 may be removed. Thus, delamination in the field areas may be avoided. Furthermore, the topology of the MR device 200 prior to planarization in step 138 is a "needle" topology. As a result, the planarization performed in step 138 may have improved uniformity and a shortened time required for planarization. The shortened time may also consume fewer resources, such as CMP slurry. Moreover, because the method 120 requires few changes in the masks used in conventional processing of MR devices, the method 120 may easily be incorporated into existing processes.

Thus, the method 100/120 can provide the magnetic element 210'. Because a single layer mask 210 is utilized, issues due to problems with lift-off and collapse of a bilayer photoresist structure can be avoided. Further, the single layer mask 210' and thus the magnetic element 220, can be made smaller than the critical dimensions of photolithography. In addition, other issues, such as delamination, may also be avoided.

We claim:

1. A method for providing at least one magnetoresistive device comprising;
   depositing a plurality of magnetoresistive element layers, the plurality of magnetoresistive element layers covering at least one device area and at least one field area;
   providing a single layer mask, the single layer mask covering a first portion of the plurality of magnetoresistive element layers in the at least one device area and exposing a second portion of the plurality of magnetoresistive element layers in the at least one field area, the single layer mask covering not more than substantially ten percent of the plurality of magnetoresistive element layers, the single layer mask having a bottom surface and a top surface not substantially wider than the bottom surface such that the single layer mask is substantially free of an undercut, the bottom surface being closer to the plurality of magnetoresistive element layers than the top surface;
   defining at least one magnetoresistive element using only the single layer mask to cover a third portion of the plurality of magnetoresistive element layers used to form the at least one magnetoresistive element, thereby removing the second portion of the plurality of magnetoresistive element layers exposed by the single layer mask;
   depositing a hard bias layer on the at least one device area and the at least one field area after the defining of the at least one magnetic element; and
   performing a planarization after the hard bias layer is deposited.

2. The method of claim 1 further comprising:
   providing a planarization stop layer between the plurality of magnetoresistive element layers and the single mask layer.

3. The method of claim 2 wherein the planarization stop layer providing further includes:
   providing a chemical mechanical planarization stop layer on the plurality of magnetic element layers before the providing of the single layer mask.

4. The method of claim 3 wherein the chemical mechanical planarization stop layer providing further includes:
   providing a diamond like carbon layer.

5. The method of claim 3 wherein the planarization performing further includes:
   performing a chemical mechanical planarization.

6. The method of claim 2 further comprising:
   providing an antireflective coating layer between the planarization stop layer and the single layer mask.

7. The method of claim 6 wherein the antireflective coating layer:
   is a dielectric antireflective coating layer.

8. The method of claim 2 wherein the at least one magnetoresistive element defining further includes:
   removing a portion of the planarization stop layer in the at least one field area; and
   removing the second portion of the plurality of magnetoresistive layers in the at least one field area.

9. The method of claim 8 wherein the removing the portion of the planarization stop layer further includes:
   performing a reactive ion etch.

10. The method of claim 8 wherein the removing the second portion of the plurality of magnetoresistive layers further includes:
    performing at least one ion milling step.

11. The method of claim 1 wherein the at least one magnetoresistive element is at least one spin valve.

12. The method of claim 1 wherein the step of providing the single layer mask further includes:
    providing the single layer mask covering ten percent of the plurality of magnetoresistive element layers.

* * * * *